US012652987B2

(12) United States Patent

Sung et al.

(10) Patent No.: US 12,652,987 B2

(45) Date of Patent: Jun. 9, 2026

(54) APPARATUS FOR TREATING SUBSTRATE AND METHOD FOR TREATING A SUBSTRATE

(71) Applicant: SEMES CO., LTD., Cheonan-si (KR)

(72) Inventors: Jin Yeong Sung, Hwaseong-si (KR); Ki Hoon Choi, Cheonan-si (KR); Hyun Yoon, Seoul (KR); Sang Hyeon Ryu, Yangpyeong (KR); Young Ho Park, Incheon-si (KR)

(73) Assignee: Semes Co., LTD., Cheonan-si (KR)

( * ) Notice: Subject to any disclaimer, the term of this patent is extended or adjusted under 35 U.S.C. 154(b) by 234 days.

(21) Appl. No.: 18/502,531

(22) Filed: Nov. 6, 2023

(65) Prior Publication Data

US 2024/0153791 A1 May 9, 2024

(30) Foreign Application Priority Data

Nov. 9, 2022 (KR) ........................ 10-2022-0149017

(51) Int. Cl.
*H10P 72/00* (2026.01)
*H10P 72/76* (2026.01)

(52) U.S. Cl.
CPC ...... *H10P 72/0421* (2026.01); *H10P 72/0436* (2026.01); *H10P 72/7618* (2026.01)

(58) Field of Classification Search
None
See application file for complete search history.

(56) References Cited

U.S. PATENT DOCUMENTS

| | | | | |
|---|---|---|---|---|
| 2015/0079701 A1* | 3/2015 | Yamashita | .............. | H01L 22/26 118/712 |
| 2022/0023975 A1* | 1/2022 | Ohta | ........................ | H01L 21/56 |
| 2022/0113619 A1* | 4/2022 | Oh | ........................... | G03F 1/72 |
| 2023/0084076 A1* | 3/2023 | Yoon | ................. | H01L 21/67028 430/5 |
| 2023/0185206 A1* | 6/2023 | Kim | .................... | G03F 7/70875 156/345.19 |
| 2023/0207324 A1* | 6/2023 | Son | ................... | H01L 21/67051 438/463 |

FOREIGN PATENT DOCUMENTS

| | | |
|---|---|---|
| KR | 10-2018-0124200 A | 11/2018 |
| KR | 10-2020-0082772 A | 7/2020 |
| KR | 10-2021-0065269 A | 6/2021 |
| KR | 10-2021-0071135 A | 6/2021 |
| KR | 10-2021-0144282 A | 11/2021 |

OTHER PUBLICATIONS

Office Action for Korean Application No. 10-2022-0149017 dated Jan. 20, 2025.

* cited by examiner

*Primary Examiner* — Shamim Ahmed

(74) *Attorney, Agent, or Firm* — Harness, Dickey & Pierce, P.L.C.

(57) ABSTRACT

The inventive concept provides a substrate treating method for etching a specific region on a substrate. The substrate treating method includes supplying a treating liquid to the substrate; and irradiating a laser to the specific region to locally heat the specific region; and wherein at the irradiating the laser, the laser is irradiated a plurality of times within the specific region, and the laser is irradiated to a region which does not overlap on the substrate, but which overlaps within the specific region.

4 Claims, 16 Drawing Sheets

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2022-0149017 filed on Nov. 9, 2022, in the Korean Intellectual Property Office, the entire contents of which are hereby incorporated by reference.

BACKGROUND

Embodiments of the inventive concept described herein relate to a substrate treating apparatus and a substrate treating method, more specifically, a substrate treating apparatus and a substrate treating method for heating a substrate to treat the substrate.

A photolithography process for forming a pattern on a wafer includes an exposing process. The exposing process is a preliminary operation for cutting a semiconductor integrated material attached to the wafer into a desired pattern. The exposing process may have various purposes, such as forming a pattern for etching and forming a pattern for an ion implantation. The exposing process uses a mask, which is a kind of 'frame', to draw a pattern with a light on the wafer. If the light is exposed to the semiconductor integrated material on the wafer, such as a photoresist on the wafer, chemical properties of the photoresist change according to the pattern by the light and the mask. If a developer is supplied to the photoresist which chemical properties have changed according to the pattern, the pattern is formed on the wafer.

In order to accurately perform the exposing process, the pattern formed on the mask must be precisely manufactured. It should be checked whether the pattern is formed to satisfy the required process conditions. A large number of patterns are formed in one mask. Accordingly, it takes a lot of time for an operator to inspect all of the large number of patterns in order to inspect one mask. Accordingly, a monitoring pattern capable of representing one pattern group including a plurality of patterns is formed on the mask. In addition, an anchor pattern capable of representing a plurality of pattern groups is formed on the mask. The operator may estimate an amount of patterns included in one pattern group through an inspection of the monitoring pattern. In addition, the operator may estimate an amount of patterns formed on the mask through an inspection of the anchor pattern.

In addition, in order to increase an inspection accuracy of the mask, it is preferable that critical dimensions of the monitoring pattern and the anchor pattern are the same. A critical dimension correction process for precisely correcting critical dimensions of patterns formed on the mask is additionally performed.

FIG. 1 shows a normal distribution of a first critical dimension CDP1 of the monitoring pattern of the mask and a second critical dimension CDP2 of the anchor pattern before the critical dimension correction process is performed during a mask manufacturing process. In addition, the first critical dimension CDP1 and the second critical dimension CDP2 have a size smaller than a target critical dimension. Before the critical dimension correction process is performed, the critical dimension CD of the monitoring pattern and the anchor pattern is intentionally deviated. And, by additionally etching the anchor pattern in the critical dimension correction process, the critical dimensions of the two patterns are made the same. If the anchor pattern is etched more than the monitoring pattern in a process of additionally etching the anchor pattern, the critical dimension of the patterns formed on the mask cannot be accurately corrected due to a difference between the monitoring pattern and the anchor pattern. When additionally etching the anchor pattern, a precise etching of the anchor pattern must be accompanied.

In order to etch the anchor pattern, an etchant is supplied to the substrate to form a liquid film on the substrate, and then a laser is irradiated on the substrate on which the liquid film is formed to locally heat the anchor pattern. In order to precisely etch the anchor pattern, the laser must be accurately irradiated to the anchor pattern. If the laser is implemented as a single shot flat-top beam, additional optical components which adjust the laser's output to be flat must be installed. Accordingly, a cost of the apparatus excessively increases. In addition, it is difficult to implement a perfect flat-top beam with a 1:1 ratio of horizontal and vertical intensity, and accordingly, it is difficult to uniformly heat an entire region of the anchor pattern. In addition, since the anchor pattern is formed in a very fine region on the substrate, other regions aside from the anchor pattern can also be heated if irradiating the single-shot flat-top beam.

SUMMARY

Embodiments of the inventive concept provide a substrate treating apparatus and method for precisely etching a substrate.

Embodiments of the inventive concept provide a substrate treating apparatus and method for locally heating a specific region on the substrate.

The technical objectives of the inventive concept are not limited to the above-mentioned ones, and the other unmentioned technical objects will become apparent to those skilled in the art from the following description.

The inventive concept provides a substrate treating method for etching a specific region on a substrate. The substrate treating method includes supplying a treating liquid to the substrate; and irradiating a laser to the specific region to locally heat the specific region; and wherein at the irradiating the laser, the laser is irradiated a plurality of times within the specific region, and the laser is irradiated to a different region on the substrate, but which overlaps at least partially within the specific region.

In an embodiment, a laser irradiation region has a form of an N-angled shape (N is a natural number larger than 3) in combination when seen from above.

In an embodiment, the N has a larger natural number as an output of the laser irradiated to the substrate decreases.

In an embodiment, an overlapping ratio of the laser irradiation region within the specific region increases as an output of the laser irradiated to the substrate decreases.

In an embodiment, a first pattern and a second pattern which is different from the first pattern are formed on the substrate, and the second pattern is formed within the specific region.

In an embodiment, the second pattern is formed of a combination of at least one row and at least one column within the specific region.

In an embodiment, a center of a region at which the second pattern is formed matches a center of a region at which the laser overlaps within the specific region.

In an embodiment, a size of a region at which the laser overlaps increases as a size of the region at which the second pattern is formed increases.

In an embodiment, the substrate treating method further includes: supplying a rinsing liquid to a rotating substrate after the irradiating the laser.

In an embodiment, the laser is a Gaussian beam.

The inventive concept provides a substrate treating method. The substrate treating method includes etching a specific region of a substrate; and supplying a rinsing liquid to the substrate; and wherein the etching the specific region includes: supplying a treating liquid to the substrate; and irradiating a laser to the specific region to heat the specific region, and the irradiating the laser includes: firstly irradiating the laser to a first irradiation region on the substrate; secondly irradiating the laser to a second irradiation region on the substrate; and thirdly irradiating the laser to a third irradiation region on the substrate, and wherein the first irradiation region, the second irradiation region, and the third irradiation region are different to each other on the substrate, and at least a portion among the first irradiation region, the second irradiation region, and the third irradiation region overlap within the specific region.

In an embodiment, a combination of virtual lines connecting a center of the first irradiation region, a center of the second irradiation region, and a center of the third irradiation region have a triangular shape, when seen from above.

In an embodiment, the irradiating the laser further includes: additionally irradiating the laser within the specific region after the thirdly irradiating the laser, and the additionally irradiating the laser is performed at least M times (M is a natural number more than 1), and an irradiation region of the laser irradiated at the additionally irradiating the laser is different from each of the first irradiation region, the second irradiation region, and the third irradiation region, but overlaps within the specific region.

In an embodiment, a combination of virtual lines connecting the center of the first irradiation region, the center of the second irradiation region, the center of the third irradiation region, and a center of the irradiation region of the laser irradiated at the additionally irradiating the laser have a polygonal shape when seen from above.

In an embodiment, the laser is a Gaussian beam.

The inventive concept provides a substrate treating apparatus. The substrate treating apparatus includes a support unit configured to support a substrate; a liquid supply unit configured to supply a liquid to a substrate supported on the support unit; a laser unit configured to irradiate a laser to a specific region on the substrate supported on the support unit; a moving unit configured to change a position of the laser unit; and a controller controlling the laser unit and the moving unit, and wherein the controller controls the laser unit and the moving unit so while the laser is irradiated a plurality of times within the specific region, each laser is irradiated to a different region on the substrate, but which overlaps at least partially within the specific region.

In an embodiment, a laser irradiation region of the laser combines to have a form of an N-angled shape when seen from above.

In an embodiment, the controller controls an irradiation number of the laser unit so the N has a larger natural number as an output of the laser irradiated to the substrate decreases.

In an embodiment, the controller controls an irradiation position of the laser unit so an overlapping ratio of the laser irradiation region increases within the specific region as an output of the laser irradiated to the substrate decreases.

In an embodiment, a first pattern and a second pattern which is different from the first pattern is formed, and the second pattern is formed within the specific region, and the controller controls the irradiation position of the laser unit so a size of a region which the laser overlaps increases, as a size of the region at which the second pattern is formed increases.

According to an embodiment of the inventive concept, a substrate may be precisely etched.

According to an embodiment of the inventive concept, a specific region on a substrate may be locally heated.

According to an embodiment of the inventive concept, an effect which is the same as a flat-top beam may be implemented with a Gaussian beam.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a cross-sectional view schematically illustrating a process chamber according to an embodiment.

FIG. 9 is a cross-sectional view illustrating the substrate treating apparatus performing a treating liquid supply step according to an embodiment.

FIG. 10 is a cross-sectional view illustrating the substrate treating apparatus performing a heating step according to an embodiment.

DETAILED DESCRIPTION

Figure 1:
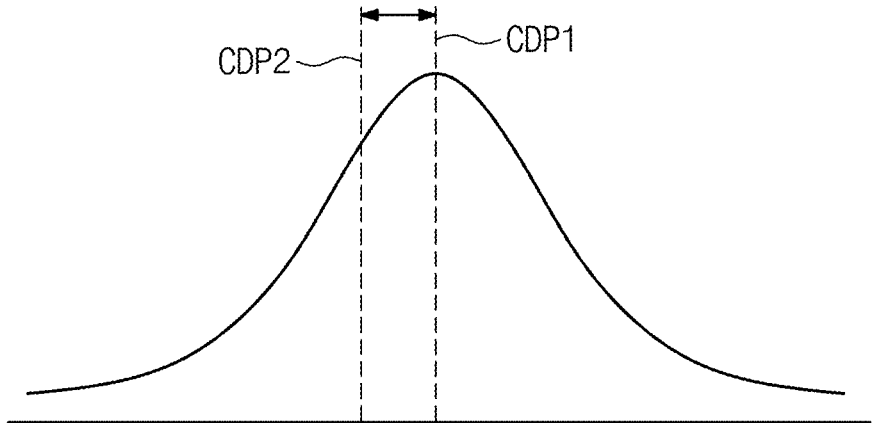
FIG. 1 illustrates a normal distribution of a critical dimension of a monitoring pattern and a critical dimension of an anchor pattern.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
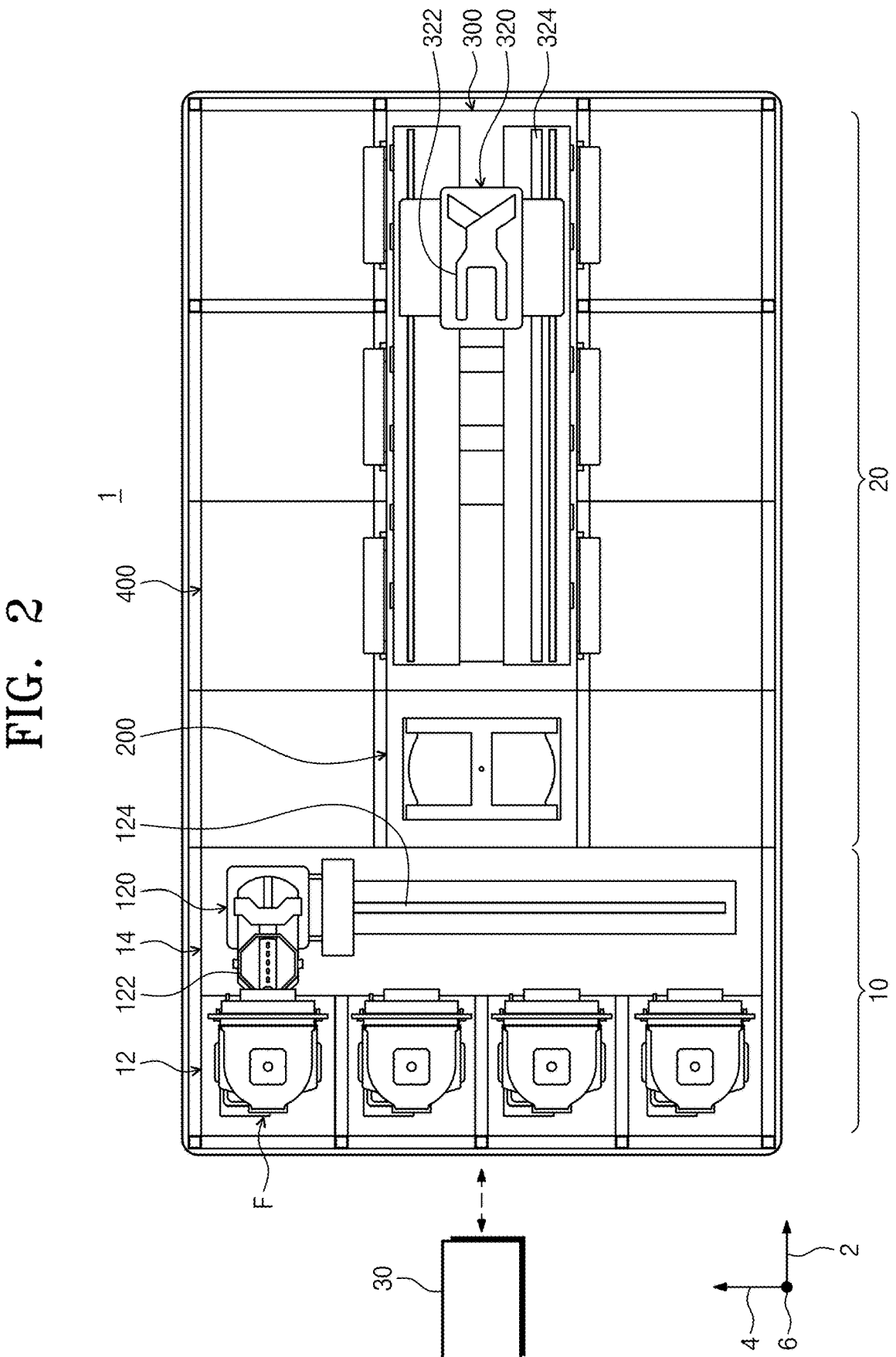
FIG. 2 is a plan view schematically illustrating a substrate treating apparatus according to an embodiment.
Figure 3:
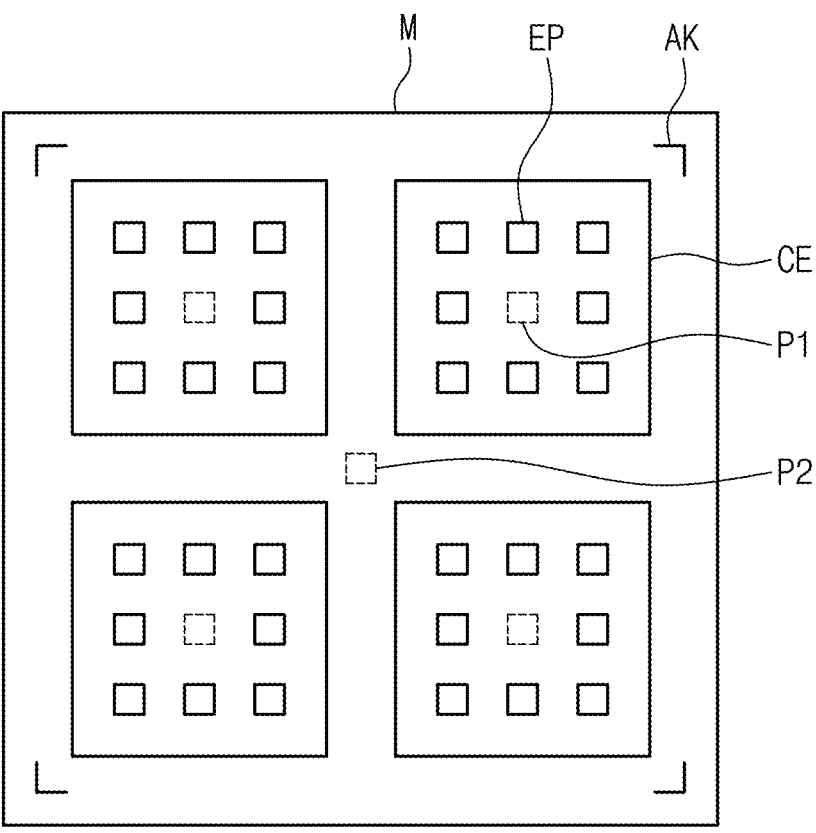
FIG. 3 is a view of a substrate according to an embodiment as viewed from above.

FIG. 2 is a plan view schematically illustrating a substrate treating apparatus according to an embodiment. FIG. 3 is a view of a substrate according to an embodiment as viewed from above.

The substrate treating apparatus 1 includes an index module 10, an index module 20, a treating module 20, and a controller 30. According to an embodiment, the index module 10 and the treating module 20 may be disposed in a direction. Hereinafter, a direction in which the index module 10 and the treating module 20 are disposed is defined as a first direction 2. Also, when viewed from above, a direction perpendicular to the first direction 2 is defined as a second direction 4, and a direction perpendicular to a plane including both the first direction 2 and the second direction 4 is defined as a third direction 6. For example, the third direction 6 may be a direction perpendicular to the ground.

The index module 10 transfers the substrate M. More specifically, the index module 10 transfers the substrate M between the container F in which the substrate M is stored and the treating module 20. The index module 10 has a lengthwise direction parallel to the second direction 4.

The index module 10 has a load port 12 and an index frame 14. A container F in which the substrate M is stored is mounted on the load port 12. The load port 12 may be disposed on an opposite side of the treating module 20 based on the index frame 14. A plurality of load ports 12 may be provided. The plurality of load ports 12 are arranged in a line along the second direction 4. The number of load ports 12 may increase or decrease according to a process efficiency and footprint conditions of the treating module 20.

The container F may be a sealed container such as a front opening unified pod (FOUP). The container F may be placed in the load port 12 by means of transfer (not shown) such as an overhead transfer, an overhead conveyor, or an automatic guided vehicle, or by an operator.

The index frame 14 has a transfer space for transferring the substrate M. An index robot 120 and an index rail 124 are disposed in the transfer space of the index frame 14. The index robot 120 transfers the substrate M between an index module 10 and a buffer unit 200 to be described later. The index robot 120 has a plurality of index hands 122. The substrate M is placed on the index hand 122. The index hand 122 may forwardly and backwardly move, rotate around the third direction 6 as an axis, and move along the third direction 6. Each of the plurality of index hands 122 may be spaced apart in a vertical direction parallel to the third direction 6. Each of the plurality of index hands 122 may move independently.

The index rail 124 has a lengthwise direction parallel to the second direction 4. The index robot 120 is placed on the index rail 124, and the index robot 120 forwardly and backwardly moves along the index rail 124.

The controller 30 may control components included in the substrate treating apparatus 1. The controller 30 may comprise a process controller consisting of a microprocessor (computer) that executes a control of the substrate treating apparatus 1, a user interface such as a keyboard via which an operator inputs commands to manage the substrate treating apparatus 1, and a display showing the operation situation of the substrate treating apparatus 1, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The treating module 20 may include a buffer unit 200, a transfer frame 300, and a process chamber 400.

The buffer unit 200 has a buffer space. The buffer space functions as a space at which a substrate M taken into the treating module 20 and a substrate M taken out from the treating module 20 temporarily stay.

The buffer unit 200 is disposed between the index frame 14 and the transfer frame 300. The buffer unit 200 is positioned on a side of the transfer frame 300. A plurality of slots (not shown) on which the substrate M is placed are installed inside the buffer unit 200. The plurality of slots (not shown) are spaced apart from each other in the vertical direction.

The buffer unit 200 has a front face and a rear face which are open. The front face may be a surface facing the index frame 14. The rear face may be a surface facing the transfer frame 300. The index robot 120 may approach the buffer unit 200 through the front face, and the transfer robot 320 to be described later may approach the buffer unit 200 through the rear face.

The transfer frame 300 provides a space for transferring the substrate M between the buffer unit 200 and the process chamber 400. The transfer frame 300 has a lengthwise direction horizontal to the first direction 2. A plurality of process chambers 400 are disposed on a side of the transfer frame 300. The transfer frame 300 and the plurality of process chambers 400 are disposed in the second direction

4. According to an embodiment, the plurality of process chambers 400 may be disposed on both side surfaces of the transfer frame 300. The process chambers 400 disposed on a side surface and the other side surface of the transfer frame 300 may have an arrangement of A×B (A and B are natural numbers greater than 1 or 1 respectively) along the first direction 2 and the third direction 6, respectively.

The transfer frame 300 has a transfer robot 320 and a transfer rail 324. The transfer robot 320 transfers the substrate M. More specifically, the transfer robot 320 transfers the substrate M between the buffer unit 200 and the process chamber 400. In addition, the transfer robot 320 transfers the substrate M between the process chambers 400. The transfer robot 320 has a plurality of hands 322 on which the substrate M is placed. The hand 322 may forwardly and backwardly move, rotate around the third direction 6 as an axis, and move along the third direction 6. The plurality of hands 322 may be disposed to be spaced apart in the direction parallel to the third direction 6 and may move independently of each other.

The transfer rail 324 is positioned in the transfer frame 300 and is formed in a direction horizontal to the lengthwise direction of the transfer frame 300. The transfer robot 320 is placed on the transfer rail 324, and the transfer robot 320 may forwardly and backwardly move along the transfer rail 324.

An object to be treated in the process chamber 400 may be a substrate of any one of a wafer, a glass, and a photomask. The substrate treated in the process chamber 400 according to an embodiment may be a photo mask which is a 'frame' used in an exposing process. The substrate M according to an embodiment may have a rectangular shape. A reference mark AK, a first pattern P1, and a second pattern P2 may be formed on the substrate M.

At least one reference mark AK may be formed on the substrate M. For example, the reference mark AK is a number corresponding to the number of corners of the substrate M, and may be formed in a corner region of the substrate M. The reference mark AK may be used to align the substrate M. More specifically, the reference mark AK may be used to determine whether the substrate M is twisted in a process of supporting the substrate M in a support unit 430 (see FIG. 4), which will be described later. In addition, the reference mark AK may be a mark used to check position information of the substrate M. More specifically, the reference mark AK may be a mark used to check a position information on a plurality of patterns formed on the substrate M. Accordingly, the reference mark AK may be defined as a so-called align key.

At least one cell CE may be formed on the substrate M. The plurality of patterns are formed in each of the plurality of cells CE. The patterns formed in each cell CE include an exposure pattern EP and a first pattern P1. The patterns formed in each cell CE may be defined as one pattern group.

The exposure pattern EP may be used to form an actual pattern on the substrate M. The first pattern P1 may be a pattern representing the exposure patterns EP formed in one cell CE. If the plurality of cells CE are formed on the substrate M, there may also be a plurality of first patterns P1 formed on the cell CE. That is, first patterns P1 may be formed in each of a plurality of cells CE. However, the inventive concept is not limited thereto, and the plurality of first patterns P1 may be formed in one cell CE.

The first pattern P1 may have a shape in which some of the exposure patterns EP are combined. The first pattern P1 may be defined as a so-called monitoring pattern. An average value of critical dimensions of the plurality of first patterns P1 may be defined as a critical dimension monitoring macro (CDMM).

If an operator inspects the first pattern P1 formed in any one cell CE through a scanning electron microscope (SEM), whether the shape of the exposure patterns EP formed in any one cell CE are good or bad may be estimated. Accordingly, the first pattern P1 may function as an inspection pattern. Unlike the above-described example, the first pattern P1 may be any one of the exposure patterns (EP) participating in an actual exposing process. Selectively, the first pattern P1 may be an inspection pattern and may be a pattern participating in an actual exposing process at the same time.

A second pattern P2 is formed outside the cells CE formed on the substrate M. That is, the second pattern P2 is formed in an outer region of a region in which the plurality of cells CE are formed. The second pattern P2 may be a pattern representing the exposure patterns EP formed on the substrate M. The second pattern P2 may be defined as an anchor pattern. A plurality of second patterns P2 may be formed outside the cells CE. The plurality of second patterns P2 may be arranged in a combination of series and/or parallel. That is, the plurality of second patterns P2 may be arranged in a combination of at least one row and at least one column. For example, five second patterns P2 may be formed on the substrate M, and the five second patterns P2 may be arranged in a combination of two columns and three rows. However, this is for the purpose of illustration, and a combination of the second patterns P2 may be variously modified.

If the operator inspects the second pattern P2 through a scanning electron microscope (SEM), it is possible to estimate whether the shape of the exposure patterns EP formed on one substrate M are good or bad. Accordingly, the second pattern P2 may function as an inspection pattern. The second pattern P2 may be an inspection pattern which does not participate in an actual exposing process. In addition, the second pattern P2 may be a pattern for setting process conditions of the exposure apparatus.

Figure 4:
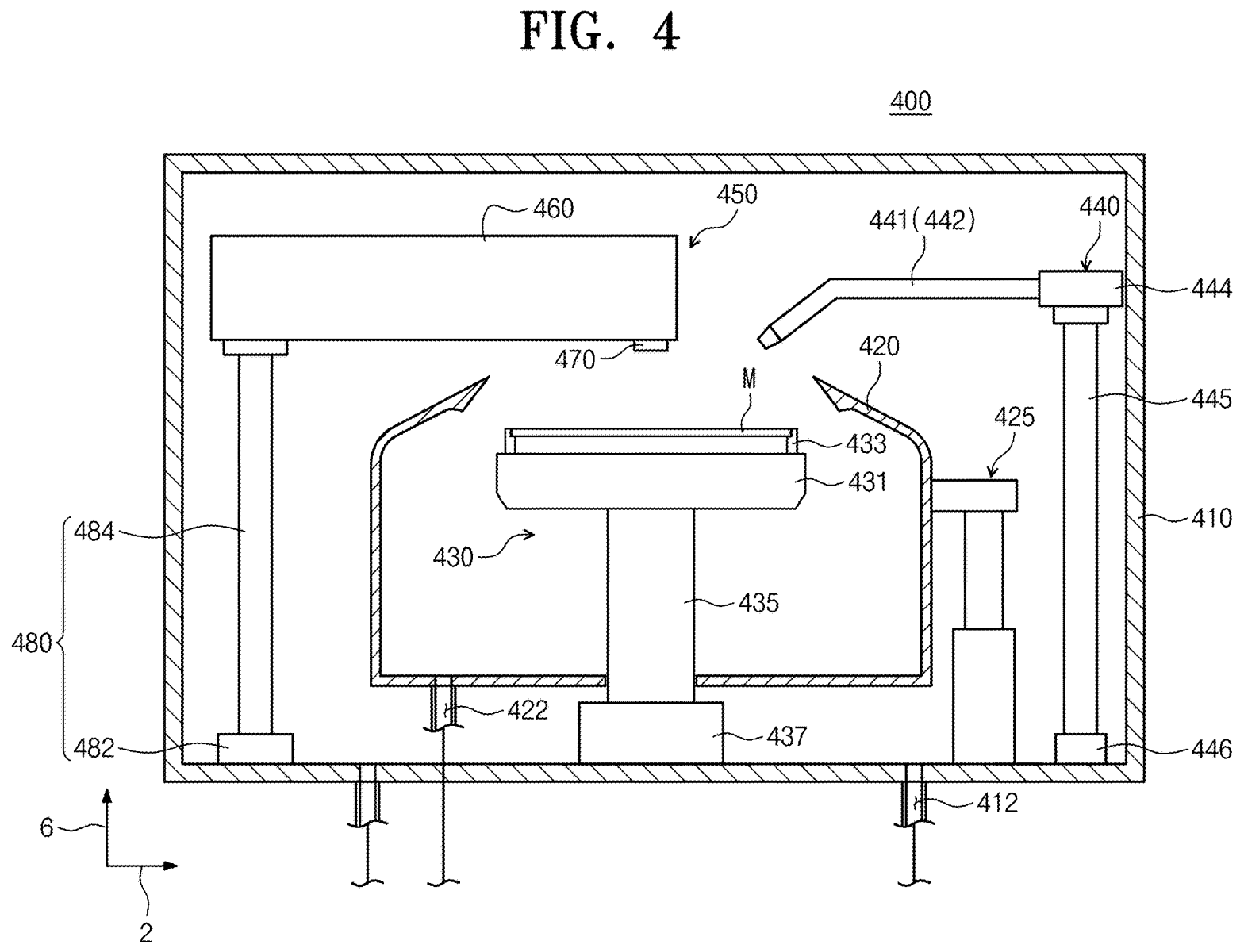
Figure 5:
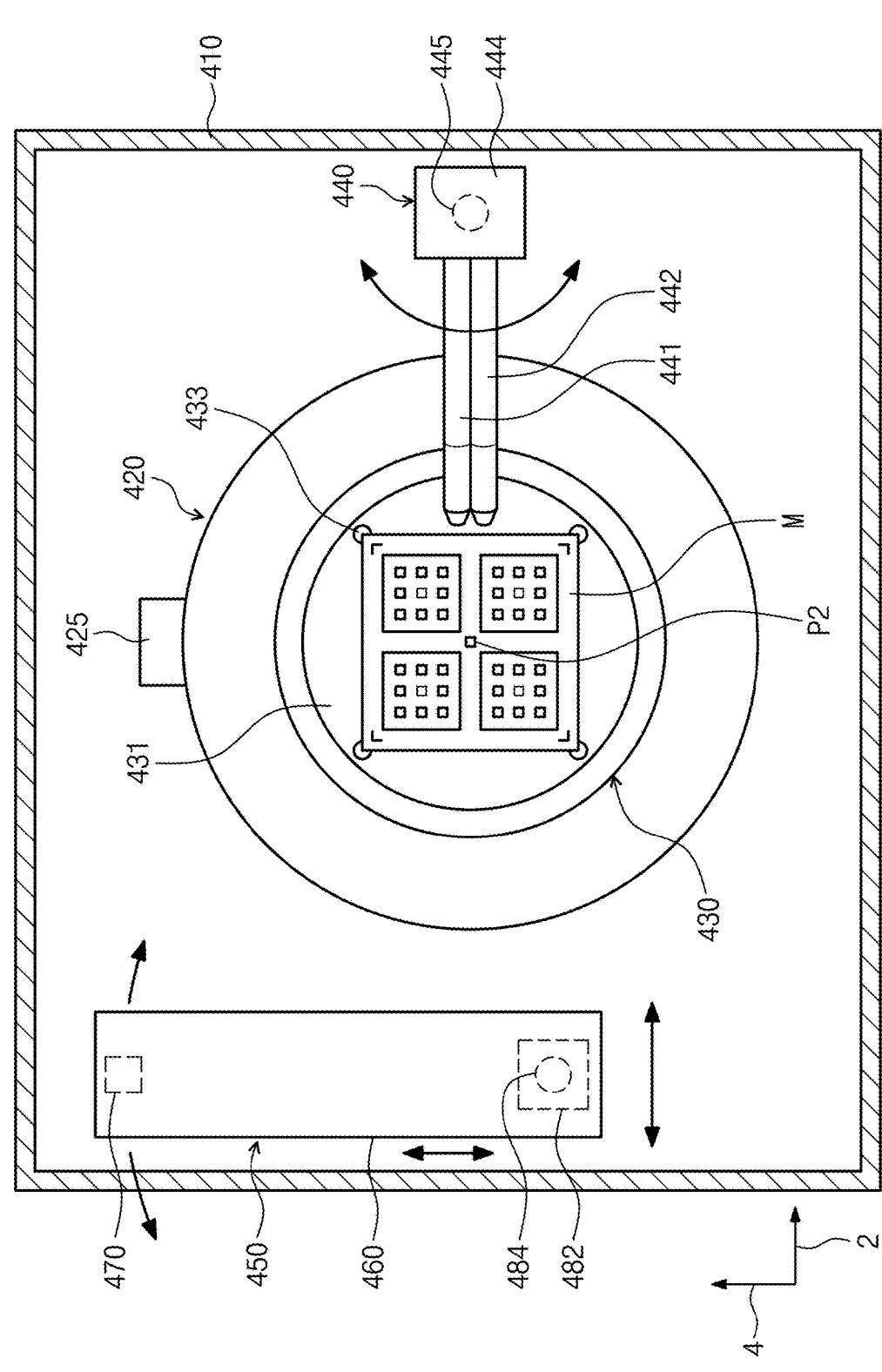
FIG. 5 is a cross-sectional view schematically illustrating the process chamber according to an embodiment.
Figure 6:
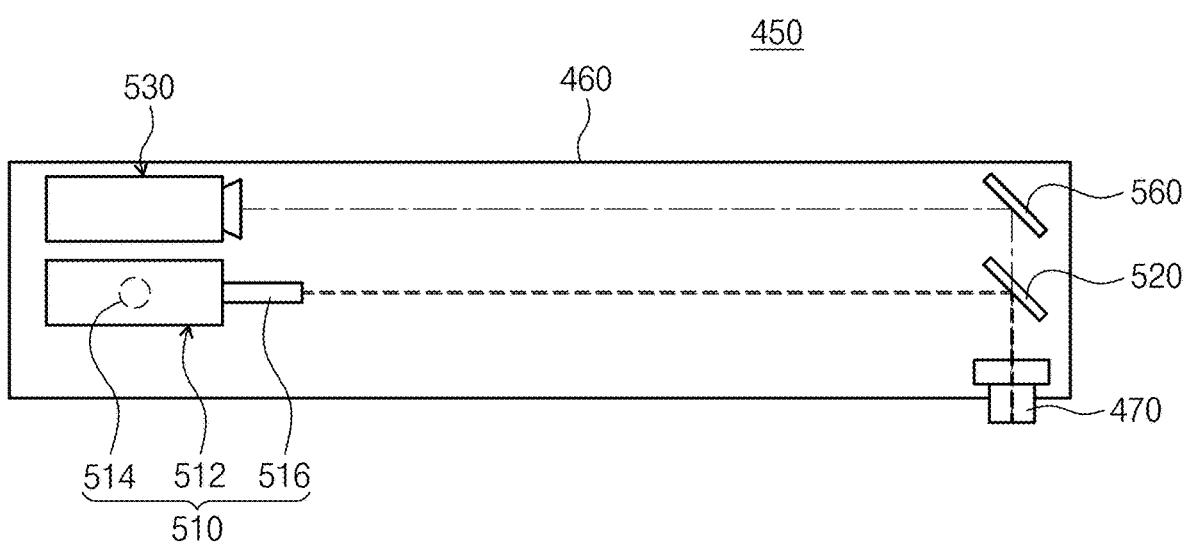
FIG. 6 is a cross-sectional view of an optical module according to an embodiment as viewed from a side.
Figure 7:
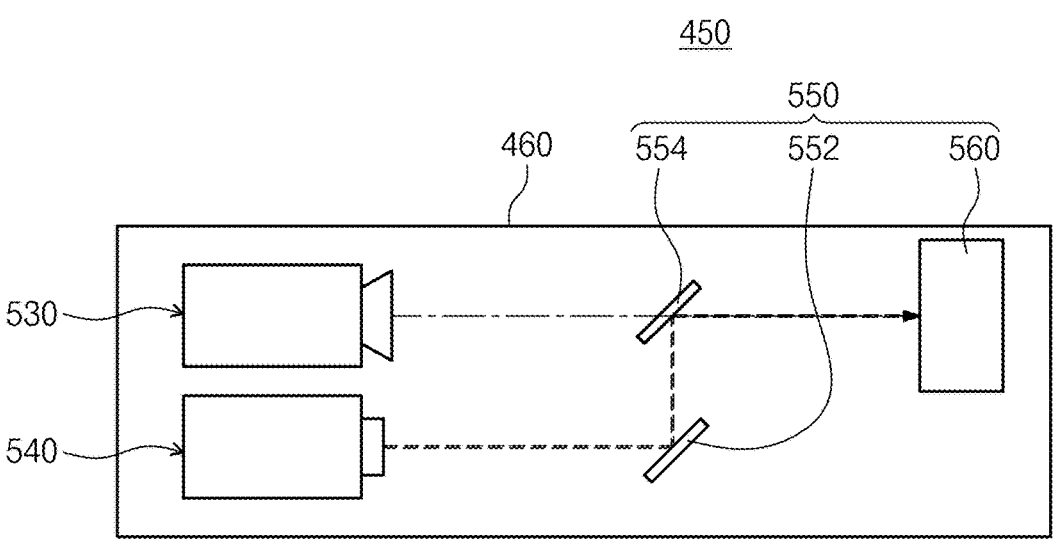
FIG. 7 is a cross-sectional view of the optical module according to an embodiment as viewed from above.

FIG. 4 is a cross-sectional view schematically illustrating the process chamber according to an embodiment. FIG. 5 is a cross-sectional view schematically illustrating the process chamber viewed from above according to an embodiment. FIG. 6 is a cross-sectional view of an optical module according to an embodiment, viewed from the side. FIG. 7 is a cross-sectional view of the optical module according to an embodiment viewed from above.

Hereinafter, the process chamber according to an embodiment of the inventive concept will be described with reference to FIG. 4 to FIG. 7.

The process chamber 400 performs a predetermined process on the substrate M. More specifically, a process performed in the process chamber 400 may be a Fine Critical Dimension Correction (FCC) during a mask manufacturing process for an exposing process. That is, in the process chamber 400, a specific pattern (e.g., a second pattern P2) among a plurality of patterns formed on the substrate M may be etched. In addition, a substrate M treated in the process chamber 400 may be the substrate M on which a pretreatment is performed. A critical dimension of a first pattern P1 and a second pattern P2 formed on the substrate M which is taken into the process chamber 400 may be different from each other. According to an embodiment, the critical dimension of the first pattern P1 may be relatively greater than the critical dimension of the second pattern P2. For example, the critical dimension of the first pattern P1 may have a first width (e.g., 69 nm), and the critical dimension of the second pattern P2 may have a second width (e.g., 68.5 nm).

The process chamber 400 may include a housing 410, a treating container 420, a support unit 430, a liquid supply unit 440, and an optical module 450.

The housing 410 may have a substantially hexahedral shape. The housing 410 has an inner space. A treating container 420, a support unit 430, a liquid supply unit 440, and an optical module 450 are placed in the inner space of the housing 410.

An entrance (not shown) through which the substrate M enters and exits is formed on a sidewall of the housing 410. The entrance (not shown) is opened and closed by a door assembly which is not shown. An inner wall surface of the housing 410 may be coated with a material having a high corrosion resistance to an etchant to be described later. In addition, an exhaust hole is formed at a bottom of the housing 410, and an exhaust line 412 is connected to the exhaust hole. The exhaust line 412 is provided with a pump (not shown) for applying a negative pressure therein. If the pump (not shown) applies the negative pressure to the exhaust line 412, an atmosphere of the inner space of the housing 410 is exhausted. In addition, foreign substances generated in a process of treating the substrate M are discharged to an outside of the housing 410 through the exhaust line 412.

The treating container 420 can prevent a liquid supplied to the substrate M from being scattered to the housing 410, the liquid supply unit 440, and the optical module 450. The treating container 420 may be a bowl having an open top portion. The treating container 420 may have a shape surrounding at least a portion of the support unit 430.

An opening into which a support shaft 435 to be described later is inserted may be formed at a bottom of the treating container 420. In addition, a discharge line 422 which discharges the liquid supplied by the liquid supply unit 440 to the outside is connected to the bottom of the treating container 420. The liquid discharged to the outside through the discharge line 422 may be reused by a regeneration system (not shown).

A side surface of the treating container 420 may upwardly extend from a bottom surface of the treating container 420. In addition, the top portion of the treating container 420 may be inclined. For example, the top portion of the treating container 420 may upwardly extend in an inclined direction with respect to the ground toward the substrate M supported by the support unit 430.

The treating container 420 may be coupled to the lifting unit 425. The lifting unit 425 may lift and lower the treating container 420 in a direction parallel to the third direction 6. The lifting unit 425 may upwardly move the treating container 420 while liquid-treating or heating the substrate M. In this case, a top end of the treating container 420 may be positioned above a top end of the substrate M supported by the support unit 430. On the other hand, if the substrate M is taken into the inner space of the housing 410 or if the substrate M is taken out of the inner space of the housing 410, the lifting unit 425 can downwardly move the treating container 420. In this case, the top end of the treating container 420 may be positioned below the top end of the substrate M supported by the support unit 430.

The support unit 430 supports and rotates the substrate M. The support unit 430 may include a body 431, a support pin 433, and a support shaft 435.

A top surface of the body 431 has a generally circular shape when viewed from above. The top surface of the body 431 may have a diameter greater than that of the substrate M.

A support pin 433 is disposed at a top end of the body 431. The support pin 433 upwardly protrudes from the top surface of the body 431. A plurality of support pins 433 may be provided. For example, there may be four support pins 433. Each of the plurality of support fins 433 may be disposed in a corner region of the substrate M having a rectangular shape.

The support pin 433 may have a first surface and a second surface. For example, the first surface may support a bottom end of a corner region of the substrate M, and the second surface may support a side end of the corner region of the substrate M. Accordingly, the second surface may limit a lateral separation of the substrate M while the substrate M rotates.

The support axis 435 has a lengthwise direction parallel to the third direction 6. The support shaft 435 may be inserted into an opening formed in a center of the bottom of the treating container 420. An end of the support shaft 435 is coupled to the bottom end of the body 431, and the other end is coupled to the shaft driver 437. The shaft driver 437 rotates the support shaft 435 using the third direction 6 as a rotation axis. If the support shaft 435 rotates, the body 431 and the substrate M also rotate. In addition, the shaft driver 437 may lift and lower the body 431 in a direction parallel to the third direction 6.

The liquid supply unit 440 supplies the liquid to the substrate M. The liquid supplied by the liquid supply unit 440 to the substrate M supported by the support unit 430 may include a treating liquid and a rinsing liquid. The treating liquid according to an embodiment may be an etchant, which is a type of etching liquid which etches patterns formed on the substrate M. In addition, the rinsing liquid according to an embodiment may be a deionized water or a deionized carbon dioxide water.

The liquid supply unit 440 may include nozzles 441 and 442. The nozzles 441 and 442 may include a first nozzle 441 and a second nozzle 442. The first nozzle 441 may supply a treating liquid to the substrate M supported by the support unit 430. In addition, the second nozzle 442 may supply the rinsing liquid to the substrate M supported by the support unit 430. Unlike the above-described example, three or more nozzles included in the liquid supply unit may be provided. A plurality of nozzles may supply different types of liquids to the substrate M supported by the support unit 430. In addition, some of the plurality of nozzles may supply the same type of liquid to the substrate M, but may supply a liquid with different composition ratios to the substrate M.

An end of the nozzles 441 and 442 are coupled to the fixing body 444, and the other end extends away from the fixing body 444. According to an embodiment, the other end of the nozzles 441 and 442 may extend at a certain angle in a direction toward the substrate M supported by the support unit 430.

The fixing body 444 is coupled to the rotation shaft 445 having a lengthwise direction parallel to the third direction 6. An end of the rotation shaft 445 is coupled to the fixing body 444, and the other end is coupled to the rotation driver 446. The rotation driver 446 rotates the rotation shaft 445 with the third direction 6 as an axis. Accordingly, the nozzles 441 and 442 may also be rotated on a horizontal plane, and their positions may be changed.

The optical module 450 may include an optical cover 460, a head nozzle 470, a moving unit 480, a laser unit 510, an imaging unit 530, and a lighting unit 540.

The optical cover 460 has an installation space therein. The installation space of the optical cover 460 has an environment sealed from the outside. Within the optical cover 460, a portion of the head nozzle 470, the laser unit 510, the imaging unit 530, and the lighting unit 540 are disposed. The head nozzle 470, the laser unit 510, the imaging unit 530, and the lighting unit 540 are modularized by the optical cover 460.

An opening is formed in the bottom portion of the optical cover 460. A portion of the head nozzle 470 is inserted into the opening formed in the optical cover 460. Accordingly, the head nozzle 470 is positioned so that a portion of the head nozzle 470 downwardly protrudes from the bottom end of the optical cover 460. The head nozzle 470 may include an objective lens and a barrel. The laser unit 510 to be described later irradiates a laser to the substrate M through the head nozzle 470. In addition, the imaging unit 530 to be described later acquires an image of the substrate M through the head nozzle 470.

The moving unit 480 is coupled to the optical cover 460. The moving unit 480 moves the optical cover 460. The moving unit 480 includes a shaft driver 482 and a shaft 484. The shaft 484 has a lengthwise direction parallel to the third direction 6. An end of the shaft 484 may be coupled to a bottom end of the optical cover 460, and the other end of the shaft 484 may be connected to the shaft driver 482. According to an embodiment, the shaft driver 482 may be a motor. The shaft driver 482 may rotate the shaft 484 with the third direction 6 as an axial direction. In addition, the shaft driver 482 may be composed of a plurality of motors. For example, one of the plurality of motors can rotate the shaft 484, the other can lift and lower the shaft 484 in the third direction 6, and the other can be mounted on a guide rail which is not shown to forwardly and backwardly move the shaft 48 in the first direction 2 or the second direction 4. A position of the optical cover 460 is changed by the shaft driver 482 described above, and a position of the head nozzle 470 is also changed.

The laser unit 510 irradiates the substrate M with the laser. The laser unit 510 irradiates the laser to a specific region of the substrate M to locally heat the specific region. The specific region according to an embodiment may be a region in which the second pattern P2 is formed.

The laser unit 510 may include an oscillation unit 512 and an expander 516. The oscillation unit 512 oscillates the laser. The oscillation unit 512 oscillates the laser to the expander 516. An output of the laser oscillated from the oscillation unit 512 may be adjusted according to process requirements. In addition, a tilting member 514 may be installed in the oscillation unit 512. The tilting member 514 may change an oscillation direction of the laser oscillating from the oscillation unit 512 by adjusting an arrangement angle of the oscillation unit 512.

The expander 516 may include a plurality of lenses which are not shown. The expander 516 adjusts an interval between the plurality of lenses to change an emission angle of the laser oscillated from the oscillation unit 512. Accordingly, the expander 516 may adjust a profile of the laser irradiated to the substrate M by expanding or reducing a diameter of the laser. The expander 516 according to an embodiment may be a variable beam expander telescope (BET). The laser adjusted by the expander 516 to a predetermined profile is transferred to a bottom reflective plate 520.

The bottom reflective plate 520 is positioned on a moving path of the laser oscillated from the oscillation unit 512. In addition, the bottom reflective plate 520 is positioned to overlap the head nozzle 470 when viewed from above. In addition, the bottom reflective plate 520 may be tilted at a certain angle so that the laser emitted from the oscillation unit 512 is transmitted to the head nozzle 470. Accordingly, the laser oscillated from the oscillation unit 512 is irradiated into the second pattern P2 through the expander 516, the bottom reflective plate 520, and the head nozzle 470 sequentially.

The imaging unit 530 acquires an image of the substrate M by imaging the substrate M. The image according to an embodiment may be a photo or a video. The imaging unit 530 may be a camera module. According to an embodiment, the imaging unit 530 may be an auto-focus camera module in which a focus is automatically adjusted. The lighting unit 540 provides a lighting to the substrate M so that the imaging unit 530 may more easily acquire an image of the substrate M.

The top reflective unit 550 may include a first reflective plate 552, a second reflective plate 554, and a top reflective plate 560.

The first reflective plate 552 and the second reflective plate 554 are installed at a height corresponding to each other. The first reflective plate 552 changes a lighting direction of the lighting unit 540. For example, the first reflective plate 552 reflects a lighting in a direction toward the second reflective plate 554. The second reflective plate 554 reflects the light again to the top reflective plate 560.

The top reflective plate 560 is disposed to overlap the bottom reflective plate 520 when viewed from above. In addition, the top reflective plate 560 is disposed above the bottom reflective plate 520. In addition, the top reflective plate 560 may be tilted at a same angle as the bottom reflective plate 520. Accordingly, the imaging unit 530 may acquire an image of the substrate M via the top reflective plate 560 and the head nozzle 470. In addition, the lighting unit 540 can provide the lighting to the substrate M via the first reflective plate 552, the second reflective plate 554, the top reflective plate 560, and the head nozzle 470. That is, an irradiation direction of the laser irradiated to the substrate M, an imaging direction of acquiring the image of the substrate M, and a lighting direction provided to the substrate M are coaxial with each other.

Figure 8:
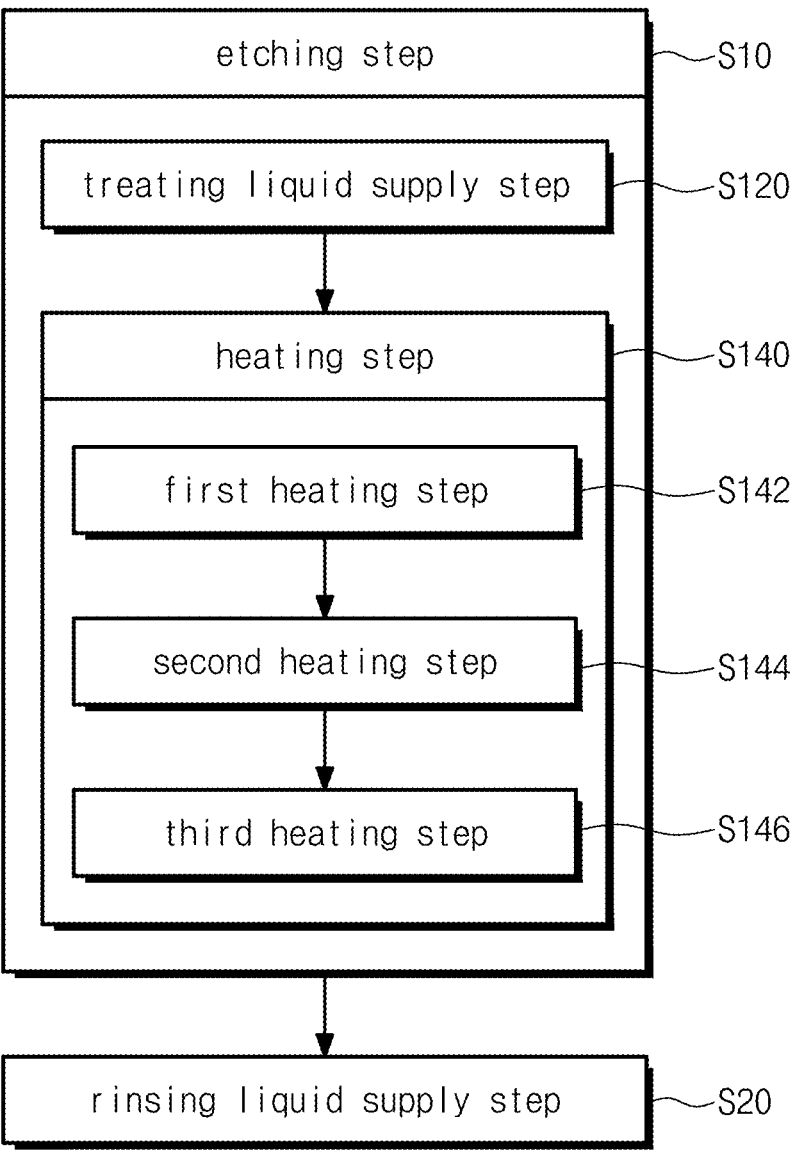
FIG. 8 is a flowchart of a substrate treating method according to an embodiment.
Figure 9:
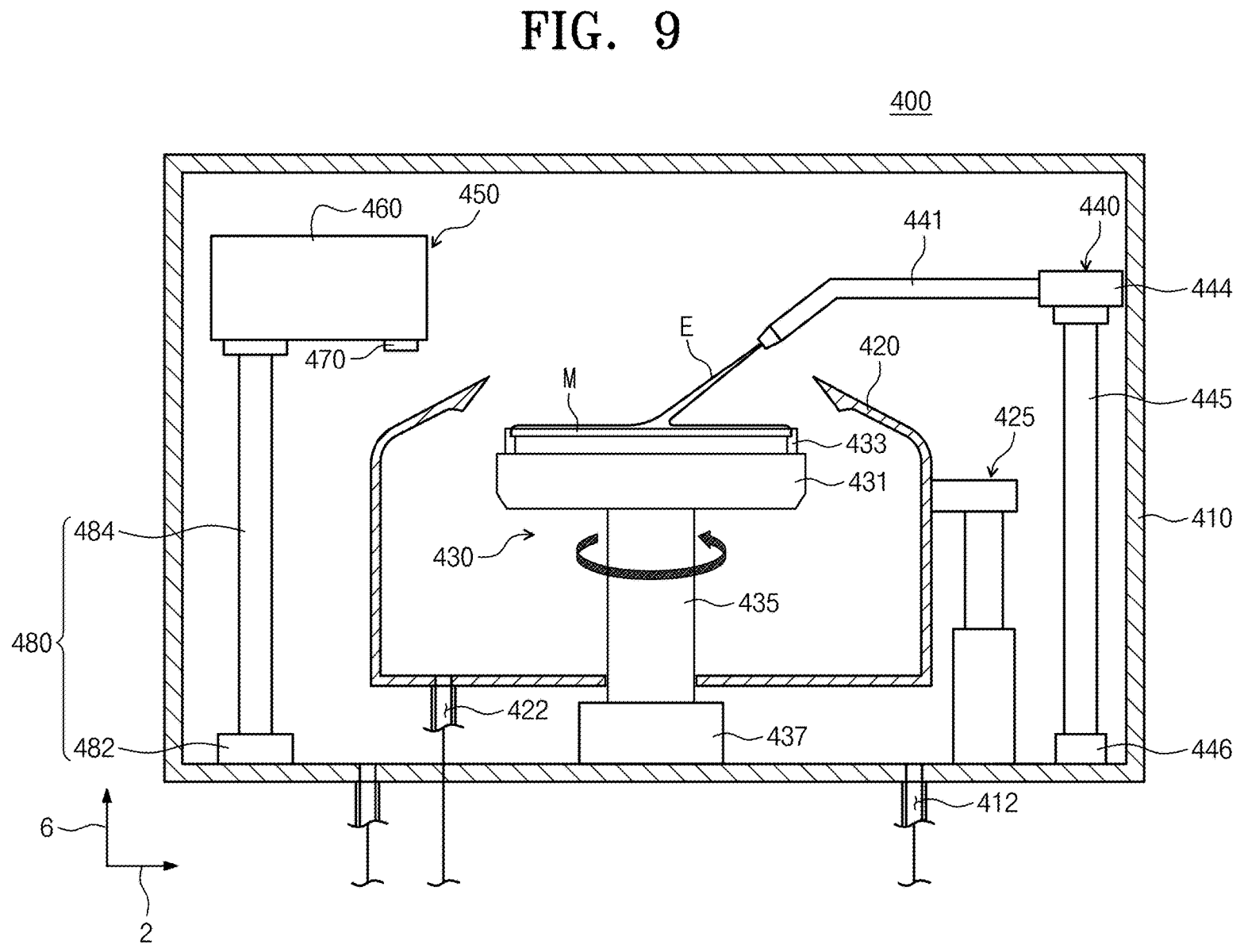
Figure 10:
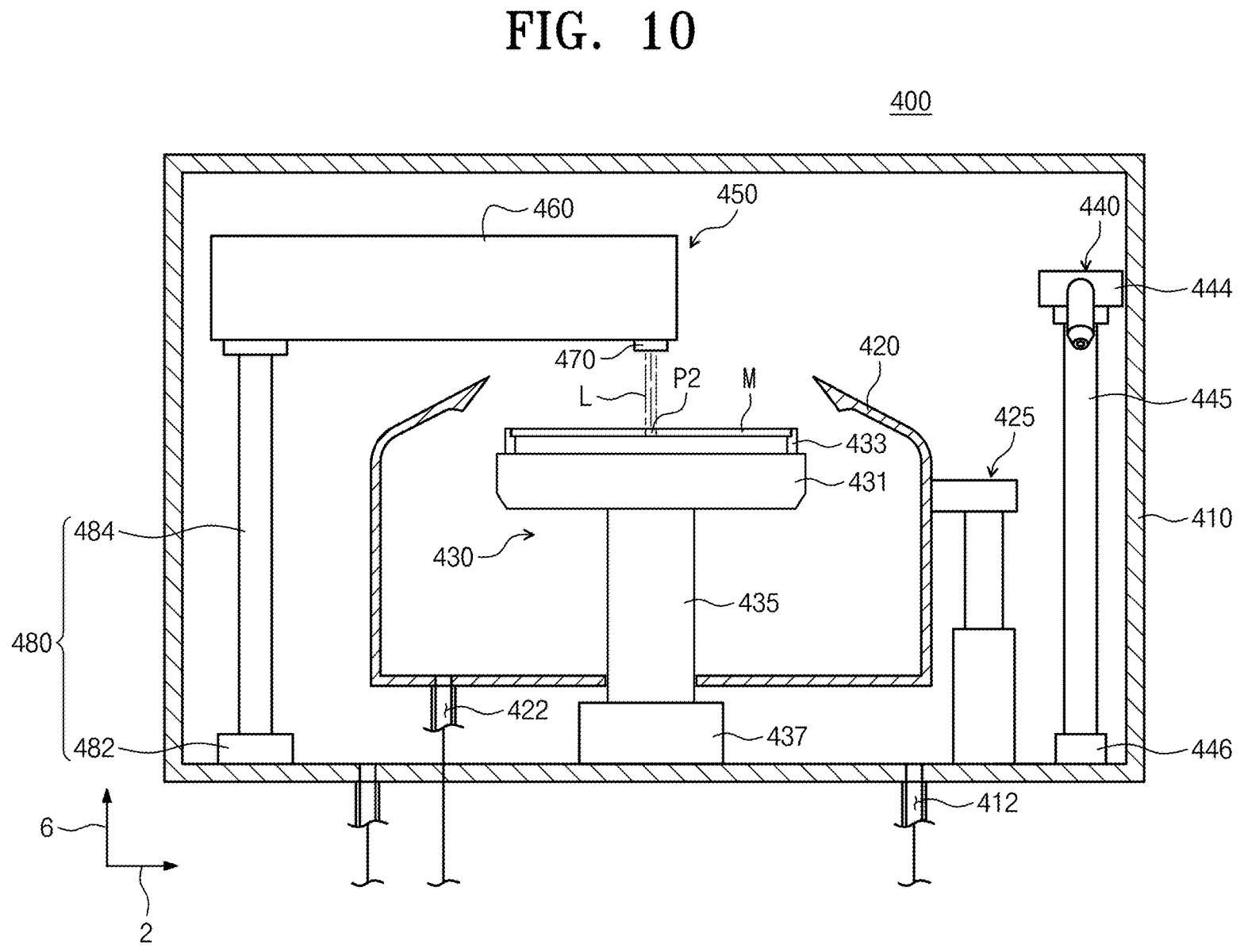
Figure 11:
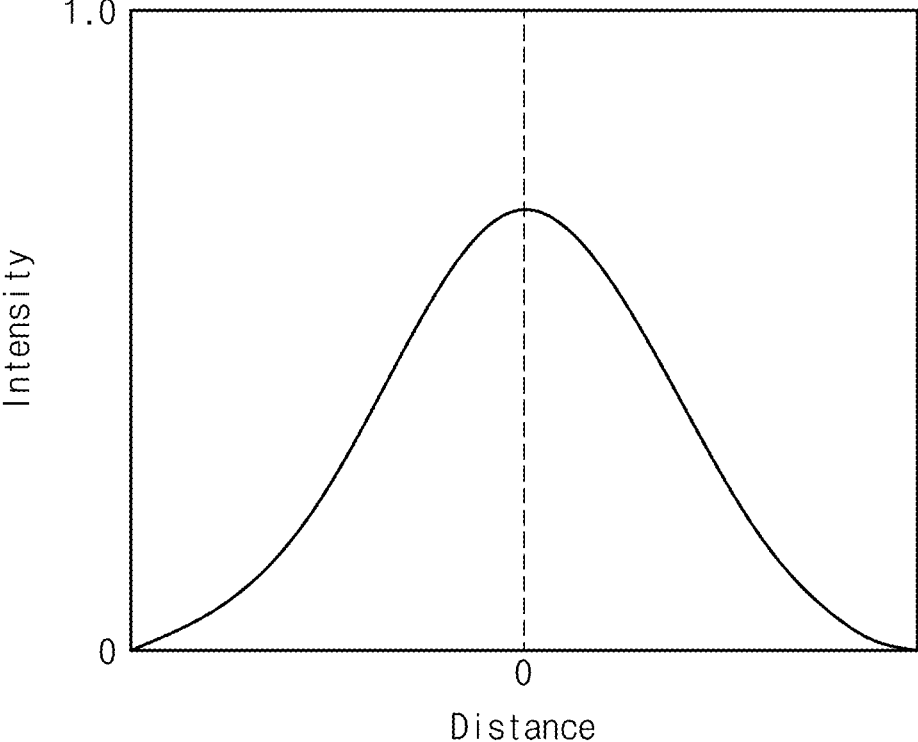
FIG. 11 is a graph schematically illustrating a profile of a laser irradiated to a substrate.
Figure 12:
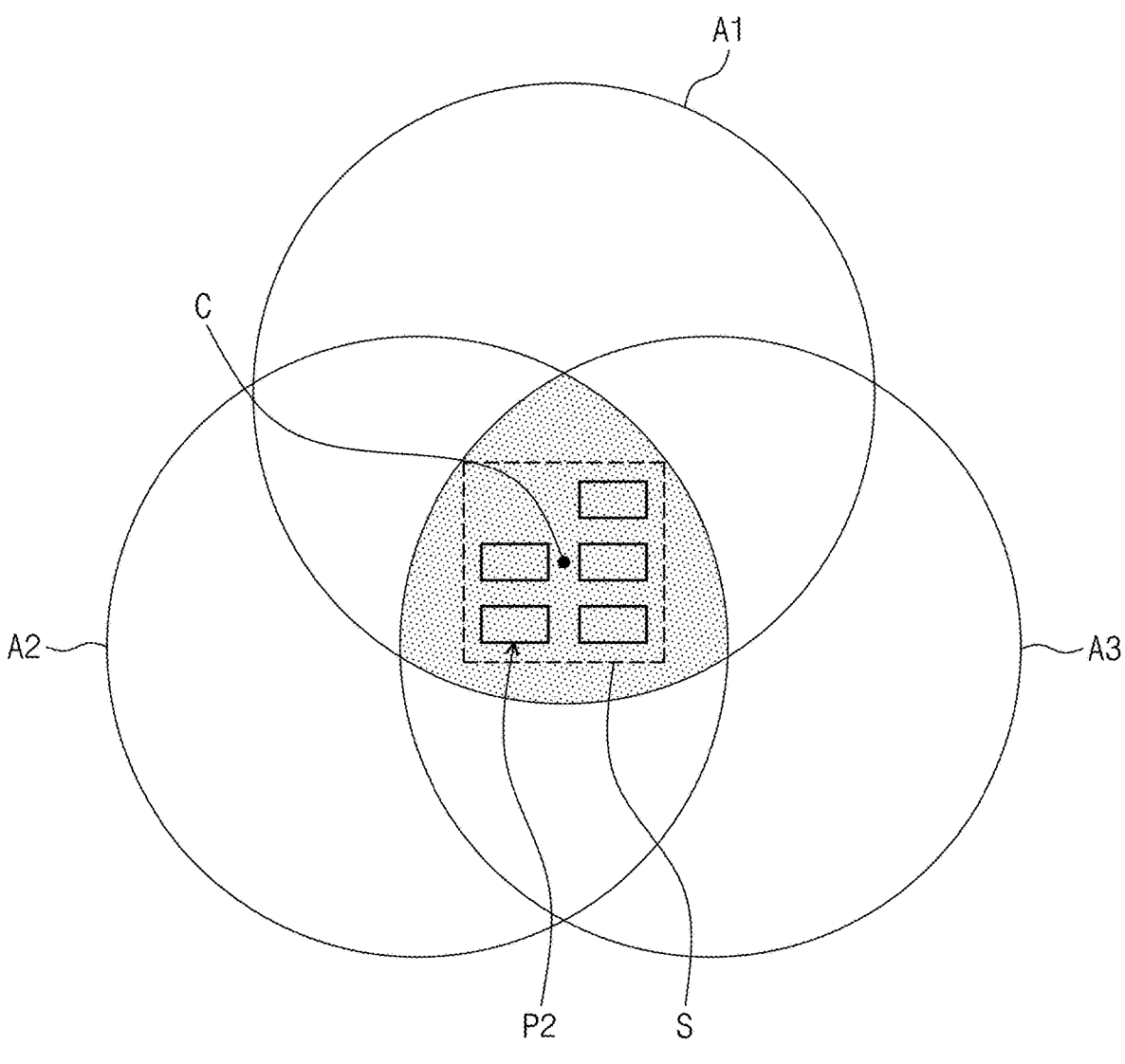
FIG. 12 schematically illustrates a state in which an irradiation region of the laser partially overlaps within a specific region of the substrate in a heating step according to an embodiment.
Figure 13:
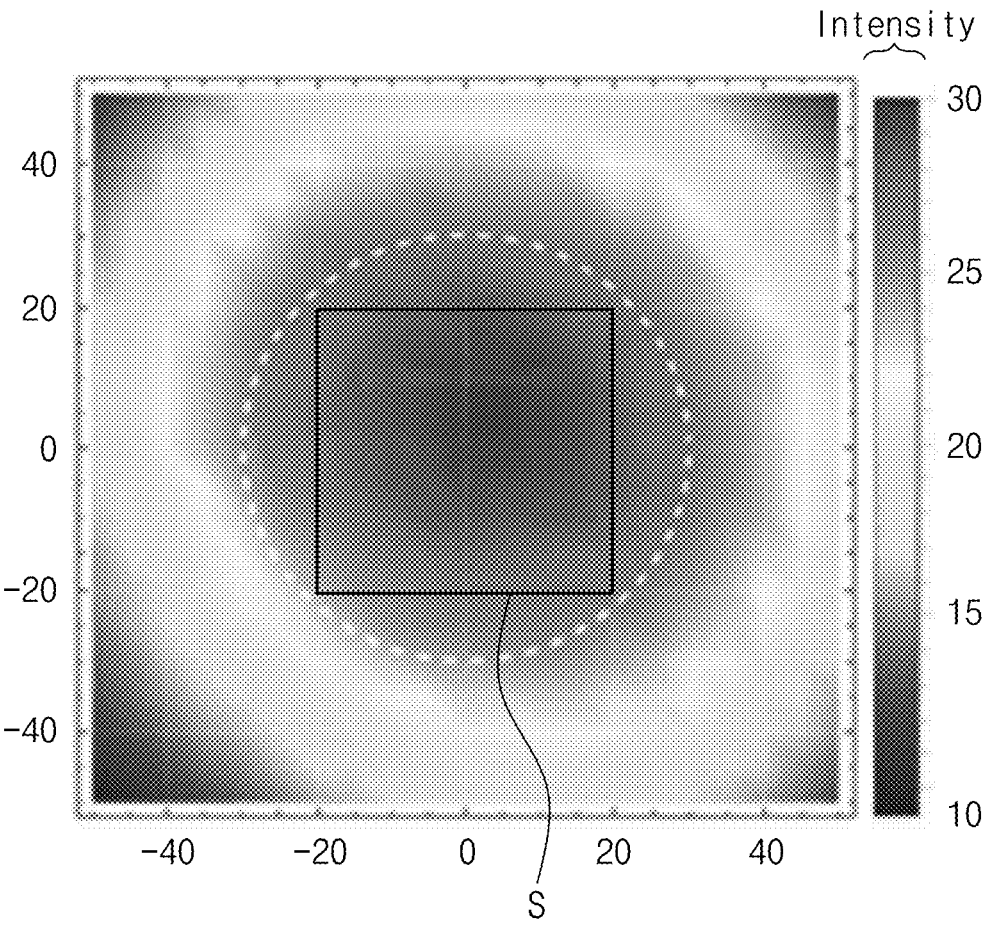
FIG. 13 schematically illustrates an intensity of the laser irradiated to the substrate in the heating step according to an embodiment.
Figure 14:
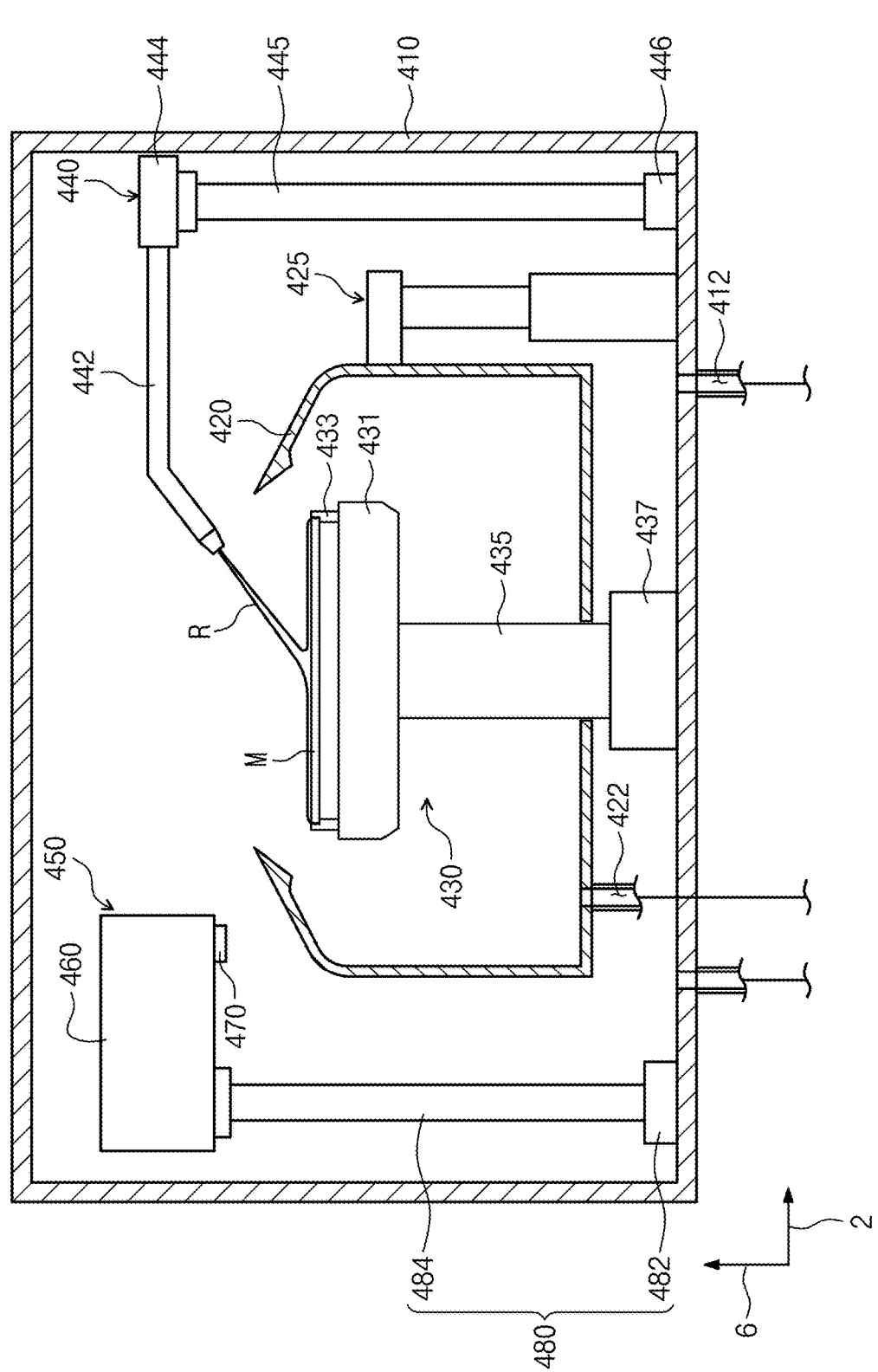
FIG. 14 is a cross-sectional view illustrating the substrate treating apparatus performing a rinsing liquid supply step according to an embodiment.

FIG. 8 is a flowchart of a substrate treating method according to an embodiment. FIG. 9 is a cross-sectional view illustrating the substrate treating apparatus performing a treating liquid supply step according to an embodiment. FIG. 10 is a cross-sectional view illustrating the substrate treating apparatus performing a heating step according to an embodiment. FIG. 11 is a graph schematically illustrating a profile of the laser irradiated to the substrate. FIG. 12 schematically illustrates a state in which an irradiation region of the laser partially overlaps within a specific region of the substrate in a heating step according to an embodiment. FIG. 13 schematically illustrates an intensity of the laser irradiated to the substrate in the heating step according to an embodiment. FIG. 14 is a cross-sectional view illustrating the substrate treating apparatus performing a rinsing liquid supply step according to an embodiment.

Hereinafter, a substrate treating method according to an embodiment of the inventive concept will be described with reference to FIG. 8 to FIG. 14. Since the substrate treating method described below is performed in the substrate treating apparatus 1 described above, the reference number cited in FIG. 2 to FIG. 7 are cited in the same way below. In addition, the substrate treating method according to an embodiment may be performed by controlling the configurations included in the substrate treating apparatus 1 by the above-described controller 30.

The substrate treatment method according to an embodiment may include an etching step S10 and a rinsing liquid supply step S20. The etching step S10 and the rinsing liquid supply step S20 may be performed in order of time series.

A process of treating the substrate M in the etching step S10 may be the aforementioned Fine Critical Dimension Correction (FCC) process. The etching step S10 etches a specific region of the substrate M. More specifically, the etching step S10 locally etches a region at which the second pattern P2 is formed among the first pattern P1 and the second pattern P2 formed on the substrate M.

The etching step S10 may include a treating liquid supply step S120 and a heating step S140. The treating liquid supply step S120 and the heating step S140 may be sequentially performed.

As shown in FIG. 9, in the treating liquid supply step S120, the treating liquid E is supplied onto the substrate M. According to an embodiment, in the treating liquid supply step S120, the treating liquid E may be supplied to the substrate M which a rotation is stopped. If the treating liquid E is supplied to the substrate M which the rotation is stopped, the treating liquid E may be supplied in an amount sufficient to form a liquid film or a puddle. For example, the amount of the treating liquid E supplied to the substrate M covers an entire top surface of the substrate M, but even if the treating liquid E does not flow down from the substrate M, the amount may not be large. If necessary, a liquid film or a puddle may be formed on the substrate M by supplying the treating liquid E to the rotating substrate M or by supplying the treating liquid E to the entire top surface of the substrate M while changing the position of the nozzle 452.

As shown in FIG. 10, the heating step S140 heats the substrate M. More specifically, the optical module 450 irradiates the laser L to a specific region of the substrate M at which the liquid film is formed (e.g., a region at which the second pattern P2 is formed). The region at which the second pattern P2 is formed is locally heated by the irradiated laser L. Accordingly, the region at which the second pattern P2 is formed may have a relatively greater degree of etching by the treating liquid than other regions on the substrate M.

In addition, the laser L irradiated to the specific region of the substrate M in a heating step S140 may be a Gaussian beam. That is, as shown in FIG. 11, a profile of the laser L irradiated to the specific region of the substrate M may have a Gaussian distribution.

In the heating step S140, the substrate M is irradiated with the laser a plurality of times. The laser irradiated to the substrate M may be irradiated to a different region on the substrate M. In addition, the laser may overlap at least partially within the specific region. That is, an irradiation region of the laser may partially overlap within the specific region.

According to an embodiment, the heating step S140 may include a first heating step S142, a second heating step S144, and a third heating step S146.

The first heating step S142, the second heating step S144, and the third heating step S146 all irradiate the laser to a specific region formed on the substrate (for example, a region at which the second pattern P2 is formed). In addition, in the first heating step S142, the laser is irradiated to a region of the substrate M (e.g., a first irradiation region) from a first irradiation position. Subsequently, the moving unit 480 changes a position of the head nozzle 470 to irradiate the laser to a region of the substrate M (e.g., a second irradiation region) from a second irradiation position. Subsequently, the moving unit 480 changes the position of the head nozzle 470 again to irradiate the laser to a region of the substrate M (e.g., a third irradiation region) from a third irradiation position. The irradiation regions of the laser irradiated from the first irradiation position, the second irradiation position, and the third irradiation position all partially overlap the region at which the second pattern P2 is formed. In addition, the irradiation regions of the laser irradiated from the first irradiation position, the second irradiation position, and the third irradiation position may be regions which do not overlap each other. According to an embodiment, the heating step S140 may include a first heating step S142, a second heating step S144, and a third heating step S146.

As shown in FIG. 12, a partial region among the irradiation region A1 of the laser irradiated to the substrate M at the first heating step S142 may overlap with a region at which the second pattern is formed S, a partial region among the irradiation region A2 of the laser irradiated to the substrate M at the second first heating step S144 may overlap with a region at which the second pattern is formed S, and a partial region among the irradiation region A3 of the laser irradiated to the substrate M at the third heating step S146 may overlap with a region at which the second pattern is formed S.

In addition, a laser irradiated in the first heating step S142, a laser irradiated in the second heating step S144, and a laser irradiated in the third heating step S146 all overlap within a region S at which the second pattern P2 is formed.

In addition, virtual lines connecting a center of a laser irradiated in the first heating step S142, a center of a laser irradiated in the second heating step S144, and a center of a laser irradiated in the third heating step S146 and can be combined with each other to have a triangular shape. More preferably, an angle formed by the virtual line connecting each center may be approximately 60 degrees.

In addition, according to an embodiment, a center of a region at which the laser irradiated at each step S142, S144, S146 may match the center of a region at which the second pattern P2 is formed when seen from above. Although not limited thereto, as described above, the second pattern P2 may be formed by a combination of various rows and columns, and thus the second pattern P2 may be heated more uniformly if a center of a region at which the laser overlaps and a center C of the region S at which the second pattern P2 is formed match.

A horizontal axis and a vertical axis shown in FIG. 13 each refer to a distance. In addition, values on a right mean an intensity of the laser. The larger the values on the right, the greater the intensity of the laser. According to the above example, the laser irradiated in the first heating step S142, the laser irradiated in the second heating step S144, and the laser irradiated in the third heating step S146 all overlap within in the region S at which the second pattern P2 is formed, and therefore the intensity of the laser is uniform within the region S at which the second pattern P2 is formed.

In addition, since the profile of the laser irradiated to the substrate M according to an embodiment has a Gaussian distribution, it is possible to efficiently irradiate a high-intensity laser on the substrate M by overlapping multiple lasers having an intermediate strength. In addition, using a laser with a Gaussian distribution profile, a laser with a high and uniform strength can be locally irradiated only to a specific region of the substrate M by having a high and uniform strength like a laser with a flat-top profile.

In addition, according to an embodiment, as the size of the region at which the second pattern P2 is formed increases (e.g., when the number of rows and columns of the second pattern P2) increases), the size of the region at which the laser overlaps may also increase. For example, each of the centers of the lasers irradiated in each heating step (S142, S144, and S146) can be moved close to the center of the second pattern P2, thereby increasing the size of the region in which each laser overlaps.

In the rinsing liquid supply step S20, the rinsing liquid R is supplied to the substrate M. More specifically, in the rinsing liquid supply step S20, the rinsing liquid R may be supplied to the rotating substrate M. The rinsing liquid R supplied to the substrate M removes etching impurities generated in the process of performing the etching step S10 from the substrate M. In addition, the rinsing liquid R replaces the liquid film formed on the substrate M to clean the substrate M.

Figure 15:
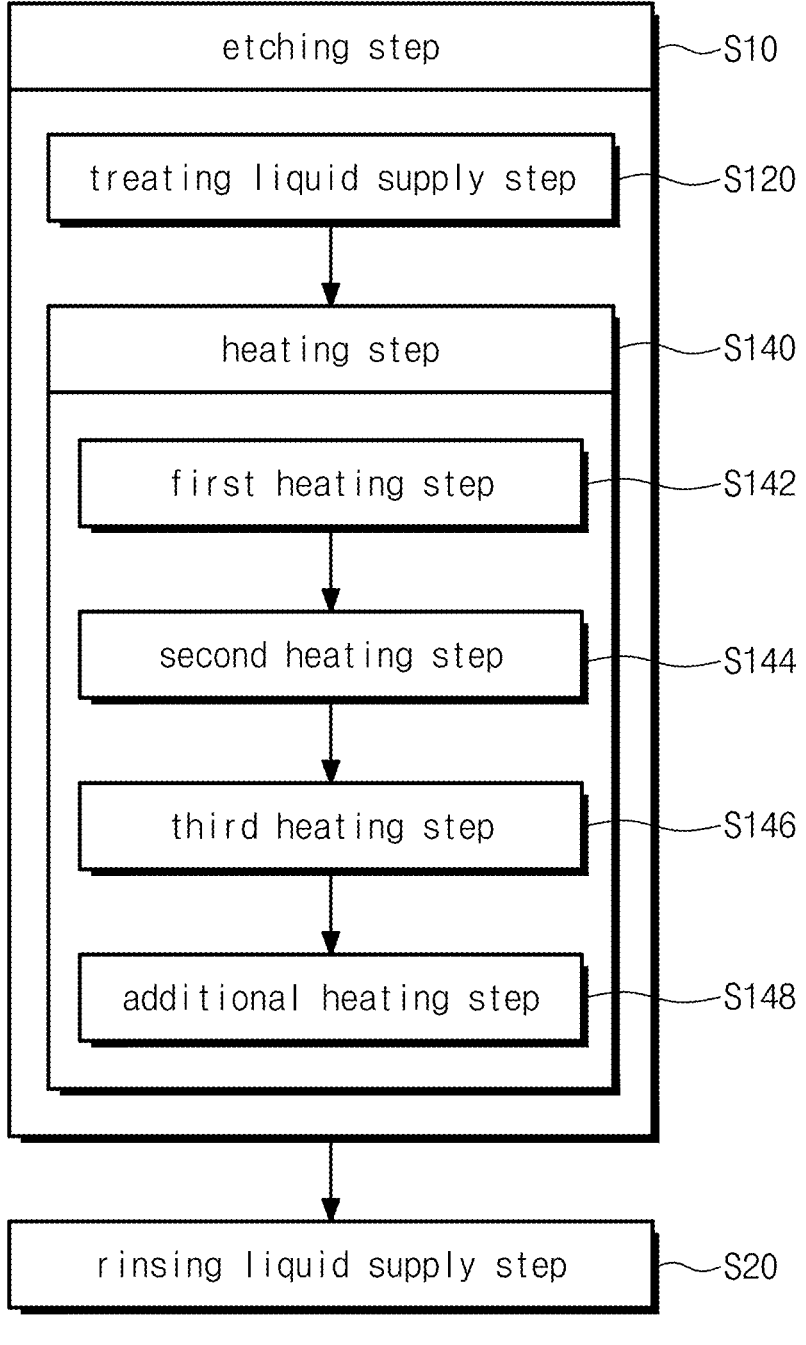
FIG. 15 is a flowchart of a substrate treating method according to another embodiment.
Figure 16:
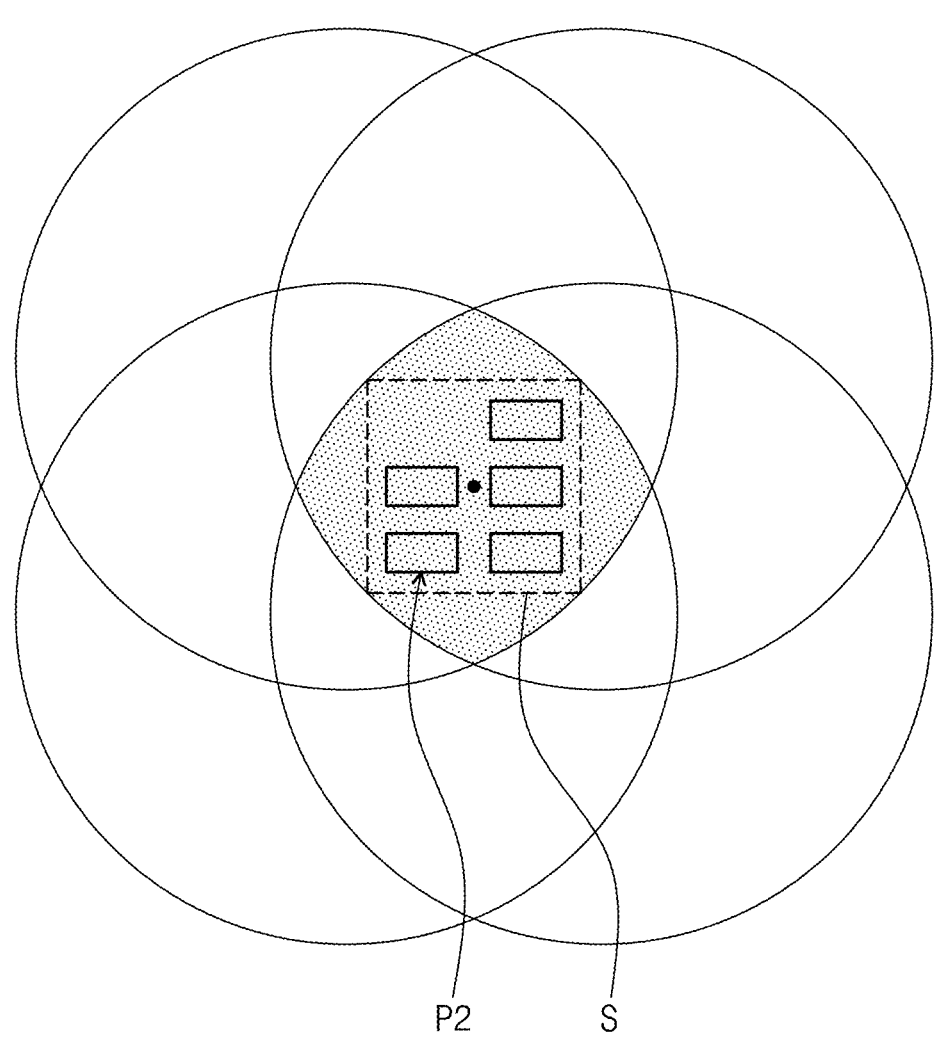
FIG. 16 and FIG. 17 schematically illustrate a state in which the irradiation region of the laser partially overlaps within the specific region of the substrate during the heating step according to another embodiment.
Figure 17:
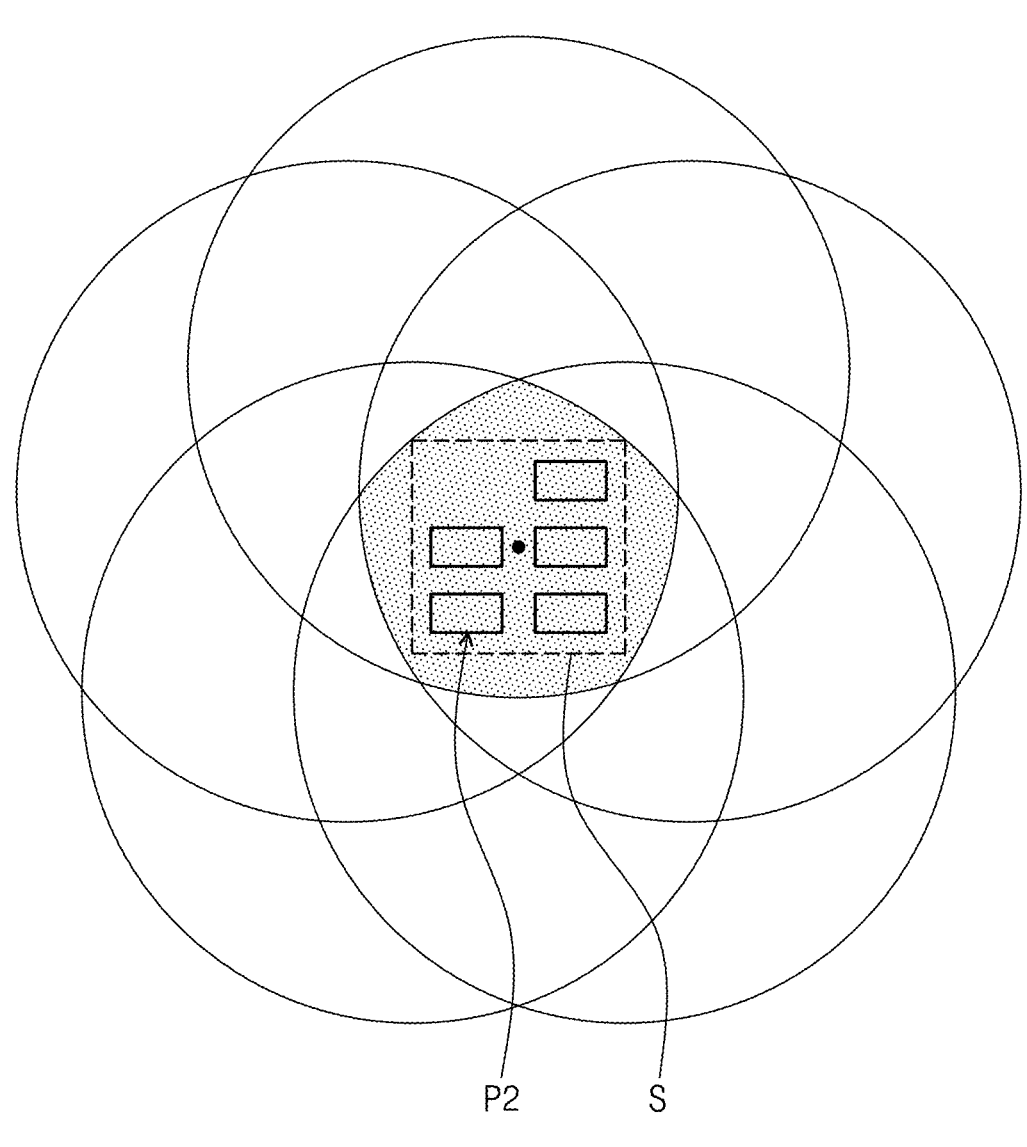

FIG. 15 is a flowchart of the substrate treating method according to another embodiment. FIG. 16 and FIG. 17 schematically illustrate a state in which the irradiation region of the laser partially overlaps within the specific region of the substrate during the heating step according to another embodiment.

The heating step S140 according to an embodiment may include a first heating step S142, a second heating step S144, a third heating step S146, and an additional heating step S148.

In the additional heating step S148, the laser is additionally irradiated to the substrate M. In the additional heating step S148, the laser may be additionally irradiated two or more times at different positions. A virtual line connecting a center of a laser irradiated in the first heating step S142, a center of a laser irradiated in the second heating step S144, a center of a laser irradiated in the third heating step S146, a center of a laser irradiated in the additional heating step S148 may have a N-angled shape (N is a natural number larger than 4).

In addition, as described above, an output of the laser oscillated from the oscillation unit 512 may be adjusted according to the process requirements. Within a region at which the second pattern P2 is formed according to a change in an output value of the laser oscillated from the oscillation unit 512, irradiation regions of the laser may overlap each other. For example, if the output value of the laser oscillated from the oscillation unit 512 is lowered, a ratio of the irradiation regions of the laser overlapping each other within the region at which the second pattern P2 is formed may be increased. That is, if the irradiation region of the laser overlaps three times within the region at which the second pattern P2 is formed if the output of the laser oscillated from the oscillation unit 512 has a first output, if a laser with a second output which is lower than the first output is irradiated to the substrate, the overlapping ratio may be adjusted so the irradiation region of the laser overlaps four times within the region at which the second pattern P2 is formed, as shown in FIG. 16. In addition, as shown in FIG. 17, the overlapping ratio can be adjusted so that the irradiation region of the laser overlaps five times within the region at which the second pattern P2 is formed S. That is, in an N-shaped shape formed by combining the irradiation regions of the laser with each other, a value of N may increase as the output value of the laser decreases. In this case, by increasing the overlapping ratio of the irradiation region of the laser within the region at which the second pattern P2 is formed, the second pattern P2 can be efficiently heated by compensating for a lowered output value of the laser.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a support configured to support a substrate;
a liquid supply configured to supply a liquid to a substrate that is supported on the support;
a laser configured to irradiate a laser light to a specific region on the substrate supported on the support;
a moving unit configured to change a position of the laser light; and
a controller configured to control the laser and the moving unit, and
wherein the controller is configured to control the laser and the moving unit such that while the laser light is irradiated a plurality of times within the specific region, each laser light is irradiated to a laser irradiation region that is a different region on the substrate, but which overlaps at least partially within the specific region, each one of the laser irradiation regions combining to form an N-angled shape on the substrate when seen from an overhead perspective, N being a natural number.

2. The substrate treating apparatus of claim 1, wherein the controller is configured to control an irradiation number of the laser so the N becomes larger as an output intensity of the laser light irradiated to the substrate decreases.

3. The substrate treating apparatus of claim 1, wherein the controller is configured to control an irradiation position of the laser such that an overlapping ratio of the laser irradiation region increases within the specific region as an output intensity of the laser light irradiated to the substrate decreases.

4. The substrate treating apparatus of claim 1, wherein a first pattern, and a second pattern which is different from the first pattern, is formed, and
the second pattern is formed within the specific region, and
the controller is configured to control an irradiation position of the laser such that a size of a region which the laser light overlaps increases, as a size of the region at which the second pattern is formed increases.

* * * * *